(12) United States Patent
Breuer et al.

(10) Patent No.: US 8,957,524 B2
(45) Date of Patent: Feb. 17, 2015

(54) PILLAR STRUCTURE FOR USE IN PACKAGING INTEGRATED CIRCUIT PRODUCTS AND METHODS OF MAKING SUCH A PILLAR STRUCTURE

(71) Applicant: GLOBALFOUNDRIES Inc., Grand Cayman (KY)

(72) Inventors: Dirk Breuer, Dresden (DE); Frank Kuechenmeister, Dresden (DE); Jens Paul, Dresden (DE); Kashi Vishwanath Machani, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 12 days.

(21) Appl. No.: 13/834,058

(22) Filed: Mar. 15, 2013

(65) Prior Publication Data

US 2014/0264890 A1 Sep. 18, 2014

(51) Int. Cl.
*H01L 23/488* (2006.01)
*H01L 23/00* (2006.01)

(52) U.S. Cl.
CPC .............. *H01L 23/488* (2013.01); *H01L 24/11* (2013.01)
USPC ........... 257/773; 438/597; 257/779; 257/778; 257/782; 257/666

(58) Field of Classification Search
CPC ................. H01L 2224/131; H01L 2224/0402; H01L 2924/014; H01L 2924/00014
USPC .......... 257/779, 773, 778, 781, 782, 786, 748
See application file for complete search history.

(56) References Cited

U.S. PATENT DOCUMENTS

| | | | |
|---|---|---|---|
| 7,208,834 B2 * | 4/2007 | Lee et al. | 257/737 |
| 7,476,564 B2 | 1/2009 | Chen et al. | |
| 7,977,160 B2 | 7/2011 | Su et al. | |
| 8,021,921 B2 | 9/2011 | Lin et al. | |
| 2010/0109159 A1 * | 5/2010 | Ho et al. | 257/737 |
| 2012/0273935 A1 * | 11/2012 | Martens et al. | 257/737 |

* cited by examiner

*Primary Examiner* — Telly Green
*Assistant Examiner* — Damian A Hillman
(74) *Attorney, Agent, or Firm* — Amerson Law Firm, PLLC (57) ABSTRACT

One illustrative pillar disclosed herein includes a bond pad conductively coupled to an integrated circuit and a pillar comprising a base that is conductively coupled to the bond pad, wherein the base has a first lateral dimension, and an upper portion that is conductively coupled to the base, wherein the upper portion has a second lateral dimension that is less than the first lateral dimension. A method disclosed herein of forming a pillar includes forming a base such that it is conductively coupled to a bond pad on an integrated circuit product and, after forming the base, forming an upper portion such that it is conductively coupled to the base.

17 Claims, 5 Drawing Sheets

PILLAR STRUCTURE FOR USE IN PACKAGING INTEGRATED CIRCUIT PRODUCTS AND METHODS OF MAKING SUCH A PILLAR STRUCTURE

BACKGROUND

1. Field of the Disclosure

Generally, the present disclosure relates to semiconductor devices, and, more particularly, to a novel pillar structure for use in packaging integrated circuit products and methods of making such a pillar structure.

2. Description of the Related Art

A multitude of semiconductor devices are typically fabricated on a single semiconductor wafer substrate. Following a fabrication process sequence, individual devices or "die" are typically separated or "diced" from the substrate by sawing or laser scribing. These die are then incorporated within a packaging structure generally designed to seal the active area of the die and electrically connect the device terminals with those of an external circuit. Depending on the type of chip and the overall device design requirements, these electrical connections may be accomplished in a variety of ways, such as, for example, by wire bonding, tape automated bonding (TAB), flip-chip bonding and the like. In recent years, the use of flip-chip technology, wherein semiconductor chips are attached to carrier substrates, or to other chips, by means of solder balls formed from so-called solder bumps, has become an important aspect of the semiconductor processing industry. In flip-chip technology, solder balls are formed on a contact layer of at least one of the chips that is to be connected, such as, for example, on a dielectric passivation layer formed above the last metallization layer of a semiconductor chip comprising a plurality of integrated circuits. Similarly, adequately sized and appropriately located bond pads are formed on another chip, such as, for example, a carrier package, each of which corresponds to a respective solder ball formed on the semiconductor chip. The two units, i.e., the semiconductor chip and carrier substrate, are then electrically connected by "flipping" the semiconductor chip and bringing the solder balls into physical contact with the bond pads, and performing a "reflow" process so that each solder ball bonds to a corresponding bond pad. Typically, hundreds of solder bumps may be distributed over the entire chip area, thereby providing, for example, the I/O capability required for modern semiconductor chips that usually include complex circuitry, such as microprocessors, storage circuits, three-dimensional (3D) chips and the like, and/or a plurality of integrated circuits forming a complete complex circuit system.

When devices are packaged using flip-chip bonding, solder beads or "bumps" often made of lead (Pb) or a lead alloy are reflowed and used to connect conductive terminals on the device to metal leads within the package. The active side of the device including the soldered interconnects is then encapsulated by an under-filling sealant that, when cured, provides an environmentally resistant barrier. However, there is an ongoing effort by semiconductor device manufacturers to eliminate the use of many potentially hazardous materials, including lead. Accordingly, other electrically conductive materials, such as copper and copper alloys, have been studied as potential replacements for lead-based solder interconnects. While copper interconnects have high electrical conductivity and improved mechanical strength compared with lead-based solders, copper is less ductile and thus is less able to absorb stress. As a result, shearing stresses between the packaging substrate and the surface of the die are often transferred by the relatively rigid copper interconnect to more brittle, back end of line (BEOL) and/or passivation layers within the die. Such stresses may be caused by, for example, a mismatch in the coefficient of thermal expansion (CTE) between the die and the packaging substrate, and can potentially fracture BEOL/passivation layers, causing device failure. Therefore, an interconnecting structure capable of providing greater stress relief is desirable to prevent fracture of BEOL/passivation layers and improve the reliability of such devices.

Figure 1A:
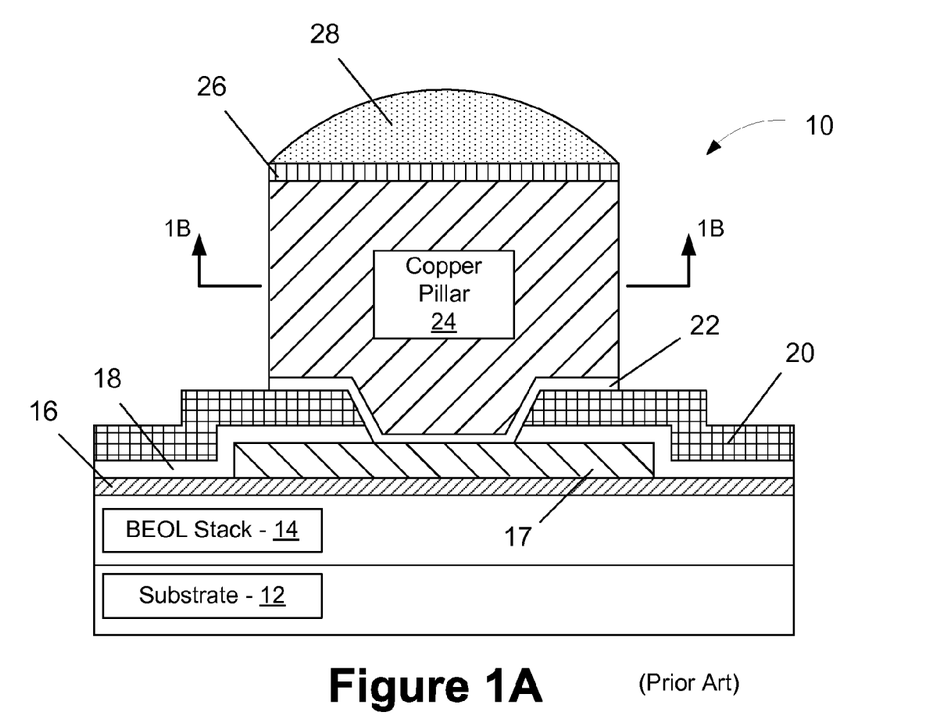
FIGS. 1A-1B depict an illustrative prior art pillar structure used in packaging integrated circuit products.
Figure 1B:
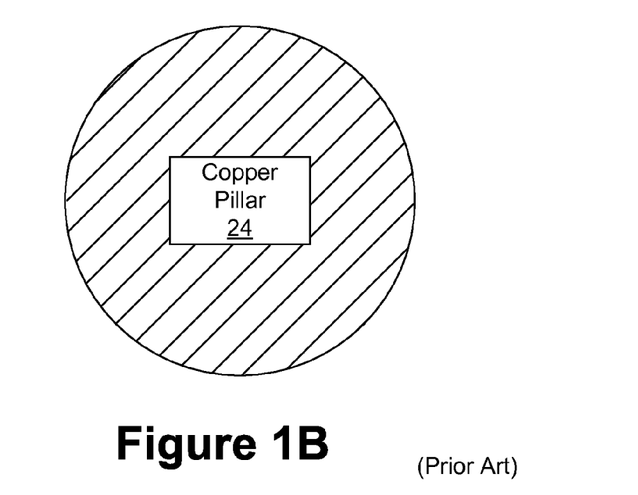

FIGS. 1A-1B depict an illustrative prior art integrated circuit device 10 comprised of an illustrative prior art copper pillar 24 that may be used in packaging integrated circuit devices. In general, the device 10 comprises a substrate 12, where integrated circuits are formed, a schematically depicted and so-called back-end-of-line (BEOL) stack 14. The BEOL stack 14 typically contains a plurality of metallization layers positioned in numerous layers of insulating material. The metallization layers contain conductive lines and vias that constitute the "wiring" for the integrated circuits that are formed in and above the substrate 12.

With continuing reference to FIG. 1A, the device 10 typically includes a lower passivation layer 16, a conductive bond pad 17, e.g., an aluminum bond pad, an upper passivation layer 18, a polyimide layer 20, a so-called under-bump metallization (UBM) layer 22, the copper pillar 24, a layer of metal 26, such as nickel, and a tin-silver bump 28. The manner in which such structures are formed are well known to those skilled in the art. Importantly, as shown in FIGS. 1A-1B, the copper pillar 24 has a substantially uniform shape and configuration along its entire vertical axis or length. In the depicted example, the copper pillar 24 has a substantially cylindrical configuration. While the substantially cylindrical copper pillar 24 may be relatively easy to fabricate, such a large and rigid structure may lead to stress-related problems such as those mentioned above. Accordingly, it would be desirable to have a pillar structure that is less rigid than the prior art copper pillar depicted in FIGS. 1A-1B and thus more useful as a conductive structure for use in packaging integrated circuit products.

The present disclosure relates to novel pillar structure for use in packaging integrated circuit products that may avoid, or at least reduce, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to a novel pillar structure for use in packaging integrated circuit products and methods of making such a pillar structure. One illustrative device disclosed herein includes a bond pad conductively coupled to an integrated circuit and a pillar comprising a base that is conductively coupled to the bond pad, wherein the base has a first lateral dimension, and an upper portion that is conductively coupled to the base, wherein the upper portion has a second lateral dimension that is less than the first lateral dimension.

Another illustrative device disclosed herein includes a bond pad conductively coupled to an integrated circuit and a pillar that is comprised of a cylindrically-shaped base that is conductively coupled to the bond pad, wherein the base has a first diameter and a cylindrically-shaped upper portion that is conductively coupled to the base, wherein the upper portion has a second diameter that is less than the first diameter.

One illustrative method disclosed herein for forming a pillar comprised of a base and an upper portion includes the steps of forming the base such that it is conductively coupled to a bond pad on an integrated circuit product and, after forming the base, forming the upper portion such that it is conductively coupled to the base.

Another illustrative method disclosed herein for forming a pillar comprised of a base and an upper portion includes the steps of forming a first patterned mask layer above an under-bump metallization layer, wherein the first patterned mask layer has a first opening that exposes a portion of the under-bump metallization layer within the first opening, forming the base within the first opening, forming a second patterned mask layer above at least the base, wherein the second patterned mask layer has a second opening that exposes a portion of the base within the second opening, and forming the upper portion above the base within the second opening.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the presently disclosed subject matter is directed to a novel pillar structure for use in packaging integrated circuit products and methods of making such a pillar structure. As will be appreciated by those skilled in the art after a complete reading of the present application, the novel pillar structure disclosed herein may be employed in packaging any type or form of integrated circuit product. It should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures.

Figure 2A:
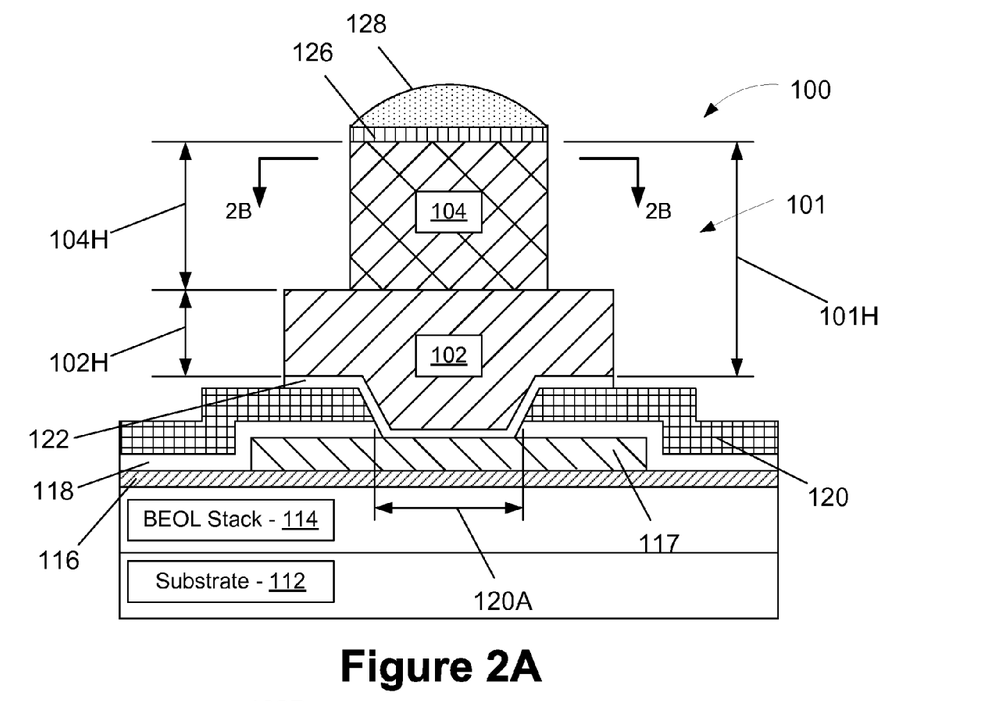
FIGS. 2A-2B schematically illustrate one illustrative embodiment of a novel pillar structure disclosed herein.
Figure 2B:
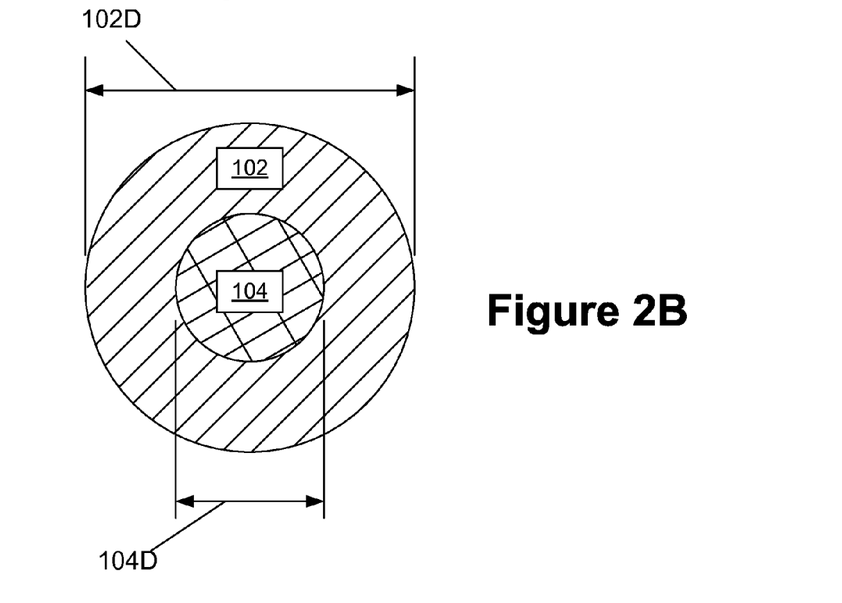

FIGS. 2A-2B depict one illustrative embodiment of an integrated circuit product or device 100 comprised of a novel pillar structure 101. In general, the device 100 comprises a substrate 112, where integrated circuits are formed, a schematically depicted back-end-of-line (BEOL) stack 114 and one illustrative embodiment of the novel pillar structure 101 disclosed herein. In the depicted example, the pillar structure 101 is comprised of a base 102, having a height 102H, and an upper portion 104, having a height 104H.

The device 100 also includes a lower passivation layer 116, a conductive bond pad 117, e.g., an aluminum bond pad, an upper passivation layer 118, a polyimide layer 120, a so-called under-bump metallization (UBM) layer 122, a layer of metal 126, such as nickel, and a tin-silver bump 128. The manner in which the layers 116, 118, 120, 122 and the bond pad 117 are formed are well known to those skilled in the art, thus they will not be described in detail herein. The various layers and structures depicted in FIGS. 2A-2B may be made of a variety of different materials. In one illustrative example, the base 102 and the upper portion 104 of the pillar may be made of a copper-containing material, e.g., copper or a copper-based alloy. In another illustrative embodiment, the base 102 may be made of a solder material such as tin-lead.

In the depicted example, the pillar 101 has a non-uniform cross-sectional configuration along it axial length or height 101H. That is, the pillar 101 has a stepped outer configuration wherein the base 102 is physically larger, in the lateral direction, than the upper portion 104, i.e., the base 102 has a lateral dimension that is larger than a lateral dimension of the upper portion 104. In the depicted example, both the base 102 and the upper portion 104 are substantially cylindrically-shaped structures. However, the base 102 and the upper portion 104 may have other shapes as well, such as, for example, octagonal, oblong, rectangular, etc. Pillars having these types of shapes may also be formed as described herein, i.e., such that a base 102 of such a pillar has a larger lateral dimension than a lateral dimension of the upper portion 104.

The physical dimensions of the pillar 101 and its components 102, 104 may vary depending upon the particular application, and they may change as future device generations continue to shrink in size and/or based upon specific customer requirements. In one illustrative example, the overall height 101H of the pillar 101 may be one the order of about 25-80 μm. In one particular embodiment, the height 102H of the base 102 may be less than about 25% of the overall height 101H of the pillar 101.

With reference to FIG. 2B, in the illustrative example where the base 102 and the upper portion 104 are substantially cylindrically-shaped structures, the diameter 102D of the base 102 may be larger than the diameter 104D of the upper portion 104. In general, all other things being equal, the base 102 should be as wide/laterally large as possible. For example, in one embodiment, the diameter 102D of the base 102 may fall within the range of about 25-80 μm. In some applications, the diameter 104H of the upper portion 104 of the pillar 101 may be set by customer requirements. In one particular embodiment, the diameter 104D of the upper portion 104 should be greater than the size of the opening 120A (see FIG. 2A) in the polyimide layer 120. In another particular embodiment, the diameter 104D of the upper portion 104 may be 25-75% less than the diameter 102D of the base 102.

Figure 3A:
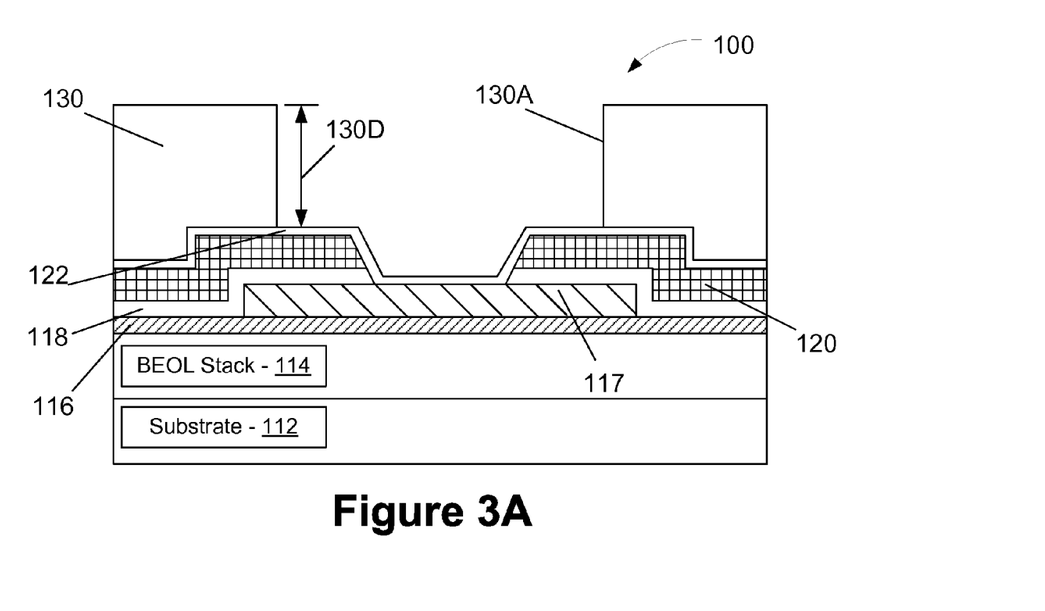
FIGS. 3A-3F depict one illustrative method of forming one embodiment of the novel pillar structure disclosed herein.

FIGS. 3A-3F depict one illustrative method of forming one embodiment of the novel pillar structure 101 disclosed herein. FIG. 3A depicts the device 100 at a point of fabrication wherein the lower passivation layer 116, the conductive bond pad 117, e.g., an aluminum bond pad, the upper passivation layer 118, the polyimide layer 120, and the under-bump metallization (UBM) layer 122 have been formed on the device 100. As noted previously, the manner in which the structures and layers mentioned in this paragraph are well known to those skilled in the art.

With continuing reference to FIG. 3A, a first patterned masking layer 130, having an opening 130A, is formed above the UBM layer 122. In general, the cross-sectional configuration of the opening 130A will conform to the desired outer configuration of the base 102. For example, for a cylindrically-shaped based 102, the opening 130A will have a circular cross-sectional configuration. In one illustrative embodiment, the depth 130D of the opening 130A is selected such that the dimension 130D is greater than the desired height 102H of the base 102. Such an arrangement insures that the growth of the material that will constitute the base 102 remains confined within the opening 130A. In one illustrative embodiment, the first patterned masking layer 130 may be a patterned layer of photoresist material that may be formed using well-known photolithography tools and techniques. The first patterned mask layer 130 could also be comprised of a variety of different hard mask materials if desired.

Figure 3B:
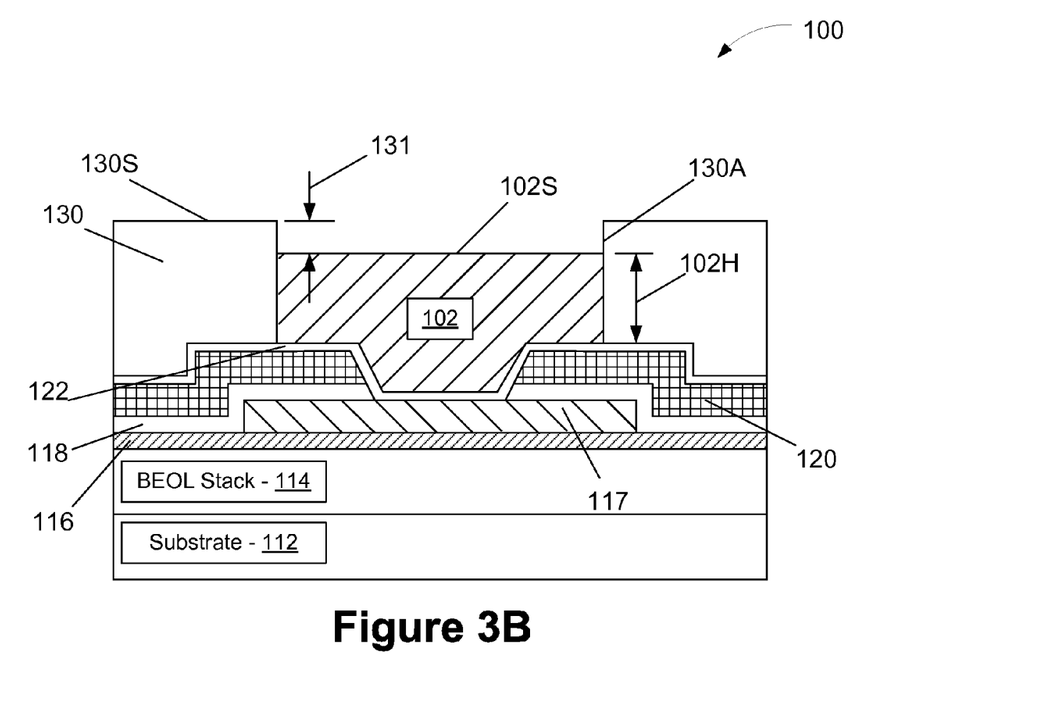

Next, as shown in FIG. 3B, plating operations are performed using the UBM layer 122 as a seed layer until such time as the base 102 is formed to its desired final height 102H. Note that, in one embodiment, the upper surface 102S of the base 102 is positioned below the upper surface 130S of the first patterned mask layer 130 by an amount reflected by the dimension 131.

Figure 3C:
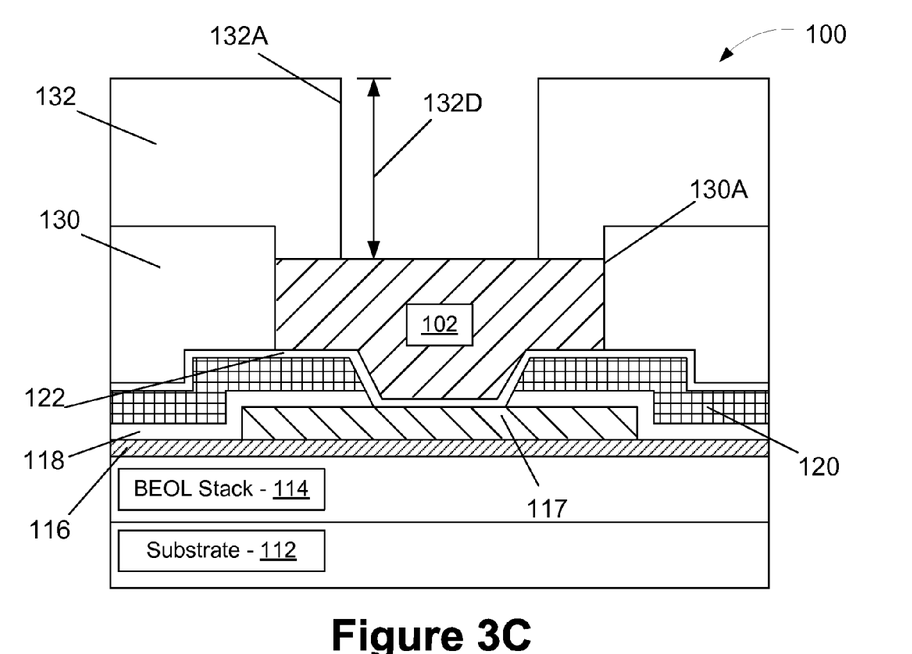

Then, as shown in FIG. 3C, a second patterned masking layer 132, having an opening 132A, is formed above the first patterned masking layer 130 and the base 102. In general, the cross-sectional configuration of the opening 132A will conform to the desired outer configuration of the upper portion 104. For example, for a cylindrically-shaped upper portion 104, the opening 132A will have a circular cross-sectional configuration. In one illustrative embodiment, the depth 132D of the opening 132A is selected such that the dimension 132D is greater than the desired height 104H of the upper portion 104. Such an arrangement insures that the growth of the material that will constitute the upper portion 104 of the pillar 101 remains confined within the opening 132A. In one illustrative embodiment, the second patterned masking layer 132 may be a patterned layer of photoresist material that may be formed using well-known photolithography tools and techniques. The second patterned masking layer 132 could also be comprised of a variety of different hard mask materials if desired. Additionally, if desired, the first patterned masking layer 130 could be removed prior to forming a thicker second patterned masking layer 132.

Figure 3D:
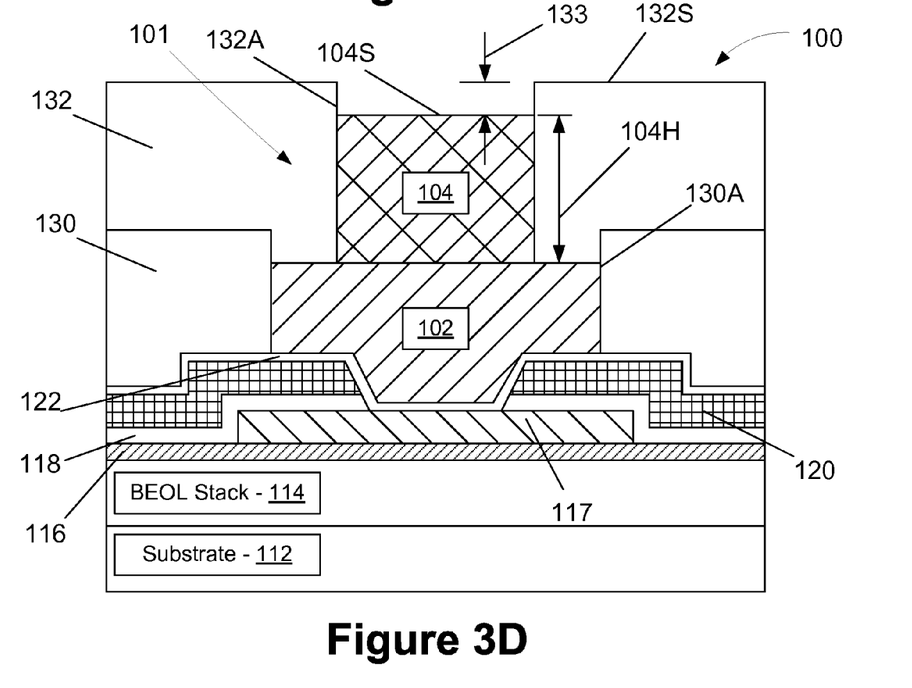

Next, as shown in FIG. 3D, plating operations are performed using the base 102 as a seed layer until such time as the upper portion 104 of the pillar 101 is formed to its desired final height 104H. Note that, in one embodiment, the upper surface 104S of the upper portion 104 is positioned below the upper surface 132S of the second patterned masking layer 132 by an amount reflected by the dimension 133.

Figure 3E:
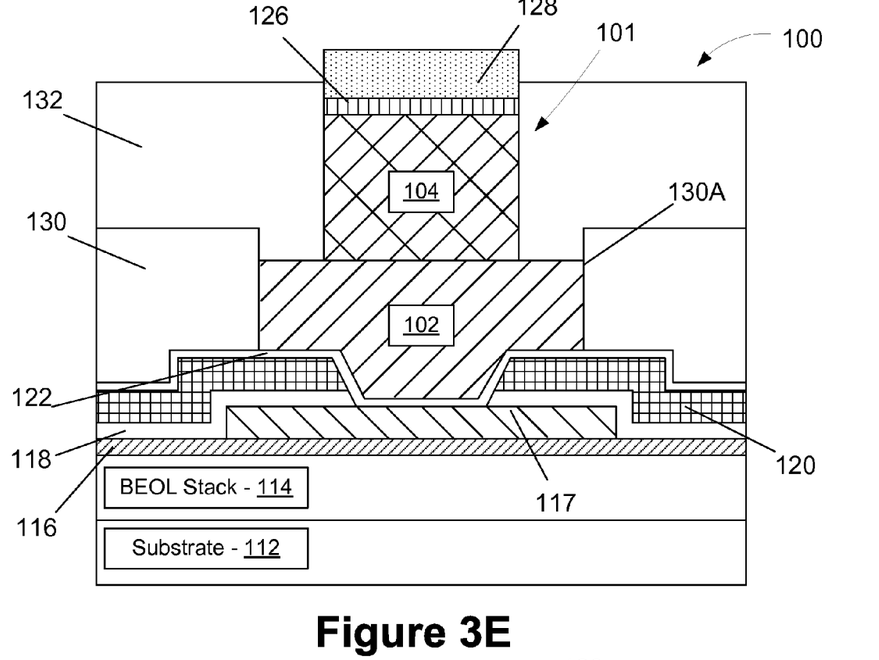
Figure 3F:
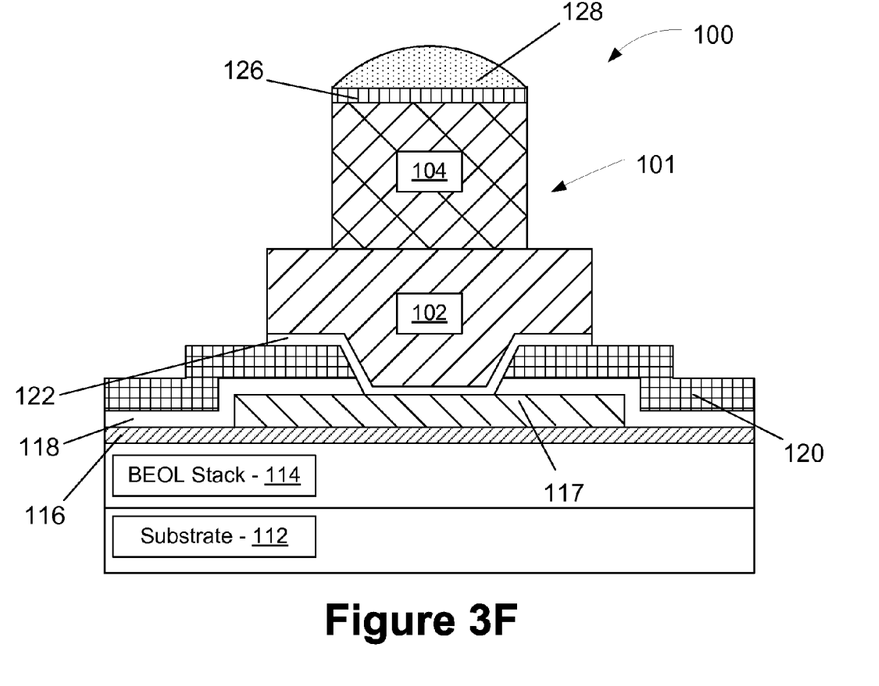

Next, as shown in FIG. 3E, a layer of metal 126, such as nickel, is formed above the pillar 101 and a layer of tin-silver 128 is formed above the pillar 101. FIG. 3F depicts the device 100 after the first and second patterned masking layers 130, 132 have been removed and an anneal process has been performed that results in the bump 128 depicted in FIG. 3F. At this point, the substrate 112 is ready to be conductively coupled to another substrate or package. Of course, those skilled in the art recognize that a typical integrated circuit product 100 would be comprised of many such pillars 101, but only one has been depicted herein for ease of explanation.

Based upon simulations, use of the novel pillar 101 described resulted in about a 38-48% reduction in the stress and strains at different levels in materials (e.g., BEOL materials, TEOS-based oxides and ultra-low k materials) adjacent the pillar 101 disclosed herein as compared to a copper pillar having the basic single diameter, cylindrical configuration like that depicted for the prior art copper pillar 24 in FIGS. 1A-1B. More specifically, the above simulation results were based upon the comparison of a copper pillar 101 as disclosed herein having a base 102 (diameter 102D of 74.5 μm; height 102H of 10 μm) and an upper portion 104 (diameter 104D of 60 μm; height 104H of 40 μm) to a single diameter copper pillar (diameter of 60 μm; height of 50 μm). Thus, the novel pillar structure 101 depicted herein provides significant benefits as compared to prior art pillar structures, such as the one depicted in the background section of this application. The novel pillar 101 disclosed herein insures that less force is transferred over the upper portion 104 of the pillar due to the use of the wider base 102 that promotes better stress distribution. In another application, where the base 102 was made of a solder material mentioned above, and the upper portion 104 was made of copper, the stresses in the surrounding materials were reduced even further, e.g., by 5-20%, depending upon the particular level under consideration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit product, comprising:
a bond pad conductively coupled to an integrated circuit; and
a pillar, comprising:
a base that is conductively coupled to said bond pad, said base having a first lateral dimension;
an upper portion that is conductively coupled to said base, said upper portion having a second lateral dimension that is less than said first lateral dimension, wherein the base and the upper portion are made of the same copper-containing material and wherein said base and said upper portion collectively define an overall height of said pillar and wherein a height of said base is equal to 25% or less of said overall height; and
a tin-silver bump that is formed above the upper portion of the pillar.

2. The product of claim 1, wherein said second lateral dimension is at least 25-75% less than said first lateral dimension.

3. An integrated circuit product, comprising:
a bond pad conductively coupled to an integrated circuit; and
a pillar, comprising:
a cylindrically-shaped base that is conductively coupled to said bond pad, said base having a first diameter;
a cylindrically-shaped upper portion that is conductively coupled to said base, said upper portion having a second diameter that is at least 25-75% less than said first diameter, wherein the base and the upper portion are made of the same copper-containing material; and
a tin-silver bump that is formed above the upper portion of the pillar.

4. The product of claim 3, wherein said base and said upper portion collectively define an overall height of said pillar and wherein a height of said base is equal to 25% or less of said overall height.

5. An integrated circuit product, comprising:
a bond pad conductively coupled to an integrated circuit; and
a pillar, comprising:
a cylindrically-shaped base that is conductively coupled to said bond pad, said base having a first diameter, said base being comprised of a copper-containing material;
a cylindrically-shaped upper portion that is conductively coupled to said base, wherein said upper portion has a second diameter that is less than said first diameter, said upper portion being comprised of said copper-containing material, wherein said base and said upper portion collectively define an overall height of said pillar and wherein a height of said base is equal to 25% or less of said overall height; and
a tin-silver bump that is formed above the upper portion of the pillar.

6. A method of forming a pillar comprised of a base and an upper portion comprised of a copper-containing material, the method comprising:
forming said base of said copper-containing material such that it is conductively coupled to a bond pad on an integrated circuit product;
after forming said base, forming said upper portion of said copper-containing material such that it is conductively coupled to said base; and
forming a tin-silver bump above the upper portion of the pillar.

7. The method of claim 6, wherein said base has a first lateral dimension and said upper portion has a second lateral dimension, wherein said first lateral dimension is greater than said second lateral dimension.

8. The method of claim 6, wherein said base has a first diameter and said upper portion has a second diameter, wherein said first diameter is greater than said second diameter.

9. The method of claim 6, wherein forming said base comprises:
forming a first patterned mask layer above an under-bump metallization layer, said first patterned mask layer having a first opening, wherein a portion of said under-bump metallization layer is exposed within said first opening; and
forming said base within said first opening.

10. The method of claim 9, wherein forming said upper portion comprises:
forming a second patterned mask layer above at least said base, said second patterned mask layer having a second opening, wherein a portion of said base is exposed within said second opening; and
forming said upper portion above said base within said second opening.

11. The method of claim 10, wherein said second patterned mask layer is formed above said first patterned mask layer.

12. A method of forming a pillar comprised of a base and an upper portion comprised of a copper-containing material, the method comprising:
forming a first patterned mask layer above an under-bump metallization layer, said first patterned mask layer having a first opening, wherein a portion of said under-bump metallization layer is exposed within said first opening;
forming said base comprised of the copper-containing material within said first opening;
forming a second patterned mask layer above at least said base, said second patterned mask layer having a second opening, wherein a portion of said base is exposed within said second opening;
forming said upper portion comprised of the copper-containing material above said base within said second opening; and
forming a tin-silver bump above the upper portion of the pillar.

13. The method of claim 12, wherein said second patterned mask layer is formed above said first patterned mask layer.

14. The method of claim 12, wherein said base has a first lateral dimension and said upper portion has a second lateral dimension, wherein said first lateral dimension is greater than said second lateral dimension.

15. The method of claim 12, wherein said base has a first diameter and said upper portion has a second diameter, wherein said first diameter is greater than said second diameter.

16. An integrated circuit product, comprising:
a bond pad conductively coupled to an integrated circuit; and
a pillar, comprising:
a base that is conductively coupled to said bond pad, said base having a first lateral dimension;
an upper portion that is conductively coupled to said base, said upper portion having a second lateral dimension that is at least 25-75% less than said first lateral dimension, wherein said base and said upper portion are made of the same copper-containing material; and
a tin-silver bump that is formed above said upper portion of said pillar.

17. An integrated circuit product, comprising:
a bond pad conductively coupled to an integrated circuit; and
a pillar, comprising:
  a cylindrically-shaped base that is conductively coupled to said bond pad, said base having a first diameter;
  a cylindrically-shaped upper portion that is conductively coupled to said base, said upper portion having a second diameter that is less than said first diameter, wherein said base and said upper portion are made of the same copper-containing material and wherein said base and said upper portion collectively define an overall height of said pillar and wherein a height of said base is equal to 25% or less of said overall height; and
  a tin-silver bump that is formed above said upper portion of said pillar.

\* \* \* \* \*